United States Patent
Fukuda

(10) Patent No.: US 9,044,778 B2
(45) Date of Patent: Jun. 2, 2015

(54) DECORATING METHOD

(75) Inventor: Shinya Fukuda, Tokyo (JP)

(73) Assignee: KABUSHIKIGAISYA FUKUDA CORPORATION, Tokyo (JP)

( * ) Notice: Subject to any disclaimer, the term of this patent is extended or adjusted under 35 U.S.C. 154(b) by 504 days.

(21) Appl. No.: 13/026,295

(22) Filed: Feb. 13, 2011

(65) Prior Publication Data

US 2011/0229652 A1    Sep. 22, 2011

(30) Foreign Application Priority Data

Mar. 16, 2010  (JP) .................................. 2010-059684

(51) Int. Cl.
| | | |
|---|---|---|
| C08J 7/06 | (2006.01) | |
| C08F 2/48 | (2006.01) | |
| B05D 7/02 | (2006.01) | |
| B05D 5/06 | (2006.01) | |
| B05D 7/00 | (2006.01) | |
| C23C 14/00 | (2006.01) | |
| C08F 2/46 | (2006.01) | |
| C08J 7/18 | (2006.01) | |
| B01J 19/08 | (2006.01) | |
| G21H 1/00 | (2006.01) | |
| G21H 5/00 | (2006.01) | |
| H01F 41/00 | (2006.01) | |
| B05D 3/06 | (2006.01) | |

(52) U.S. Cl.
CPC . B05D 7/02 (2013.01); B05D 3/067 (2013.01); B05D 5/065 (2013.01); B05D 5/067 (2013.01); B05D 7/52 (2013.01); C23C 14/0015 (2013.01)

(58) Field of Classification Search
CPC ...... C23C 14/0015; B05D 5/065; B05D 7/02; B05D 7/52; B05D 3/067; B05D 5/067
USPC .................................. 427/509, 508, 487, 457
See application file for complete search history.

(56) References Cited

U.S. PATENT DOCUMENTS 7,824,515 B2 * 11/2010 Ishida ........................... 156/235
2011/0313121 A1 * 12/2011 Kaminade et al. ............. 526/282

FOREIGN PATENT DOCUMENTS

| JP | 2003326895 A | * | 11/2003 |
| JP | A-2005-296841 | | 10/2005 |
| JP | 2006281726 A | * | 10/2006 |
| JP | 2007054827 A | * | 3/2007 |
| JP | 2007268323 A | * | 10/2007 |
| JP | A-2008-189807 | | 8/2008 |

OTHER PUBLICATIONS

Oct. 1, 2013 Office Action issued in Japanese Patent Application No. 2010-059684.

* cited by examiner

*Primary Examiner* — Kelly M Gambetta
(74) *Attorney, Agent, or Firm* — Oliff PLC

(57) ABSTRACT

A decorating method includes the steps of coating a base material with a coating composition comprising 45-95 parts of urethane methacrylate, 1-50 parts of a compound having at least an intra-molecular radical polymeric double bond, and 0.1-15 parts of photopolymerization initiator. The coating is hardened to form an under coat. Vacuum deposition of indium and/or tin in a crystalline structure-independent way is performed to form a non-conductive thin film. Then, a UV-hardening resin, poly acrylic-urethane resin, or acrylate-silica resin is applied, which is hardened to form a hard coat layer.

1 Claim, No Drawings

DECORATING METHOD

FIELD OF THE INVENTION

The present invention relates to a method of forming a decorative resin base material, and in particular, relates to a method that provides iridescent colors on a non-conductive thin film. The iridescence has no adverse effects on electromagnetic transmissions of communications devices, such as mobile phones, mobile electronics and the like. Furthermore, the iridescent decoration can be coated onto the operation buttons with indium, tin film or oxide layers that have inferior abrasion resistance.

BACKGROUND OF THE INVENTION

In general, it is possible to provide a decorative polychromatic multilayer film made of laminated metal layers that provides rainbow colors and a pleasing appearance; however, these decorate layers interfere with electromagnetic (EM) transmissions used in communication devices, and in addition exhibit inferior abrasion resistance. Therefore, such decorations are limited to use in casings or parts of a mobile phone or other electric device that do not in require abrasion resistance.

In the prior art decorating method, microparticles of glass and metal are admixed into a coating material, and exhibit diffuse reflections. However, the particles settle during application because of the different specific gravities between the coating material and the microparticles.

Thus, several processes for making a laminate have been considered. For instance, in a method that substantially excludes the use of microparticles, an under coat forming composition substantially free of rainbow colored (i.e., iridescent) microparticles is coated onto a base material and hardened; then, a thin metal film is formed on the hardened layer, thereby producing an iridescent laminate having a metal layer with an irregular surface. The coating composition comprises urethane methacrylate, a compound having one or more intra-molecular radical polymeric double bonds, and a photopolymerization initiator (as described in JP 2007-54827); or in an iridescent transfer film, of which a release layer, a protective layer, and an iridescent layer with a high refractive index are formed on both sides of a low refractive index film, and an adhesive layer is formed sequentially on one side of a plastic film, a high refractive index film on at least one side of the metal film and is formed on the low refractive index film (as described in JP 2003-326895); or a decorative plastic 10 is mounted on resin plastic with multiple layered laminate films 12, which selectively reflects visible light at specific wavelengths, thereby providing iridescence. The multiple layered laminate film 12 is formed by alternatively laminating a first resin film as a first layer 12a, and onto which a second resin film as a second layer 12b, integrating at least eleven layers (as described in JP 2006-216493).

However, the laminate as described in JP 2007-54827 and JP 2003-326895 adversely affect EM transmissions of devices onto which it is mounted because of the existence of the metal film in the laminate. Additionally, the production of the laminate as described in JP 2006-216493 having at least eleven layers of resin with different refractive indices is complicated and time-consuming.

SUMMARY OF THE INVENTION

This invention is based on the unexpected discovery that utilizing vacuum deposition on the upper surface of an under coat to form a non-conductive thin film can maintain good EM transmissions for communications devices, such as mobile phones and other mobile devices, while providing a decorative surface for the device formed from an under coat, a conductive film layer, and hardened coat in a simple process. The decoration can display rainbow colors, and is thus useful as a high quality metal gloss.

In one aspect, the present invention provides a method for creating an iridescent decorative surface, including the steps of: coating a base material surface with a coating composition comprising 45-95 parts of urethane methacrylate obtained in the reaction of polyester diol from polyalkylene glycol and adipic acid, a diisocyanate compound and a hydroxyl group containing methacrylate, 1-50 parts of a non-urethane methacrylate compound having at least an intra-molecular radical polymeric double bond, and 0.1-15 parts of photopolymerization initiator (by mass) by way of spraying, dipping or or spinning, or by in-mold transfer printing; hardening the coating composition to form an under coat; performing vacuum deposition of indium (In) and/or tin (Sn) so as not to connect crystalline structures thereof. respectively, or vacuum deposition of at least one of silica (SiO), silicon dioxide ($SiO_2$), zirconium dioxide ($ZrO_2$), cerium oxide ($CeO_2$), alumina ($Al_2O_3$), titanium oxide ($Ti_3O_5$), magnesium oxide (MgO), and chromium (Cr) onto an upper surface of the under coat to form a non-conductive film layer; and applying a UV-hardening resin, or 1 drop of poly acrylic urethane resin, or 2 drops of poly acrylic urethane resin, or 2 drops of acrylic silicon resin onto an upper surface of the non-conductive film by way of a spraying, dipping or spinning application or in-mold transfer printing; and hardening the UV-hardening resin, or 1 drop of poly acrylic urethane resin, or 2 drops of poly acrylic urethane resin, or 2 drops of acrylic silicon resin by irradiation to form a hardened coat layer.

DETAILED DESCRIPTION OF THE INVENTION

The present invention relates to a method of providing a decorative base material. The decorative method provides an iridescent decoration during the formation of a non-conductive thin film. In this way, the iridescent decoration has no adverse effects on EM transmissions of communications devices, such as mobile phones or other mobile devices, and can be coated onto operation buttons and confer abrasion resistance to an indium, tin film or oxide layer that has inferior abrasion resistance.

In one embodiment, the decorative method disclosed in claim 1 is an iridescent decorative method comprising the steps of: coating a base material surface with a coating composition comprising 45-95 parts by weight of urethane methacrylate obtained in the reaction of polyester diol from polyalkylene glycol and adipic acid, diisocyanate compound and hydroxyl methacrylate, 1-50 parts by weight of a non-urethane methacrylate compound having at least an intra-molecular radical polymeric double bond, and 0.1-15 parts by weight of a photopolymerization initiator by spraying, dipping or spinning applications or in-mold transfer printing; hardening the coating composition by active energy irradiation to form an under coat; performing vacuum deposition of indium (In) or tin (Sn) onto an upper surface of the under coat to form a non-conductive; film so as not to connect crystalline structure thereof; and applying a UV-hardening resin, or 1 drop of poly acrylic urethane resin, or 2 drops of poly acrylic urethane resin, or 2 drops of acrylic silicon resin onto an upper surface of the non-conductive film by a spraying or dipping or spinning application or in-mold transfer printing; and hardening the coated UV-hardening resin, or 1 drop of poly acrylic urethane resin, or 2 drops of poly acrylic urethane resin, or 2 drops of acrylic silicon resin by active energy irradiation to form a hardened coat layer.

In another embodiment, the decorating method disclosed in claim 2 is an iridescent decorating method comprising the steps of: coating a base material surface with a coating composition comprising 45-95 parts by weight of urethane methacrylate obtained in the reaction of polyester diol from polyalkylene glycol and adipic acid, a diisocyanate compound and hydroxyl methacrylate, 1-50 parts by weight of a non-urethane methacrylate compound having at least an intra-molecular radical polymeric double bond, and 0.1-15 parts by weight of a photopolymerization initiator by way of spraying, dipping or spinning or in-mold transfer printing; hardening the coating composition by active energy irradiation to form an under coat; performing vacuum deposition of indium (In) and tin (Sn) on an upper surface of the under coat to form a non-conductive film layer; layer so as not to connect crystalline structures thereof, respectively: and applying a UV-hardening resin, or 1 drop of poly acrylic urethane resin, or 2 drops of poly acrylic urethane resin, or 2 drops of acrylic silicon resin onto an upper surface of the non-conductive film layer by spraying, dipping or spinning or in-mold transfer printing; and hardening the coated UV-hardening resin, or 1 drop of poly acrylic urethane resin, or 2 drops of poly acrylic urethane resin, or 2 drops of acrylic silicon resin by active energy irradiation to form a hardened coat layer.

In another embodiment, the decorating method as disclosed in claim 3 is an iridescent decorating method comprising the steps of: coating a base material surface with a coating composition comprising 45-95 parts by weight of urethane methacrylate obtained in the reaction of polyester diol from polyalkylene glycol and adipic acid, a diisocyanate compound and hydroxyl methacrylate, 1-50 parts by weight of a non-urethane methacrylate compound having at least an intra-molecular radical polymeric double bond, and 0.1-15 parts by weight of a photopolymerization initiator by a way of spraying, dipping or spinning or in-mold transfer printing; hardening the coating composition by active energy irradiation to form an under coat; performing vacuum depositing of at least one of silica (SiO), silicon dioxide (SiO2), zirconium dioxide (ZrO2), cerium oxide (CeO2), alumina (Al2O3), titanium oxide (Ti3O5), magnesium oxide (MgO), and chromium (Cr) onto an upper surface of the under coat to form a non-conductive film layer; and applying a UV-hardening resin, or 1 drop of poly acrylic urethane resin, or 2 drops of poly acrylic urethane resin, or 2 drops of acrylic silicon resin onto an upper surface of the non-conductive film layer by way of a spraying, dipping or spinning application or in-mold transfer printing; and hardening the UV-hardening resin, or 1 drop of poly acrylic urethane resin, or 2 drops of poly acrylic urethane resin, or 2 drops of acrylic silicon resin by active energy irradiation to form a hardened coat layer.

The specific examples below are to be construed as merely illustrative, and not limitative of the remainder of the disclosure in any way whatsoever. Without further elaboration, it is believed that one skilled in the art can, based on the description herein, can utilize the present invention to its fullest extent. All publications cited herein are hereby incorporated by reference in their entirety. Further, any mechanism proposed below does not in any way restrict the scope of the claimed invention.

EXAMPLE

In embodiments of the invention, the base materials preferably are those that may be used in the casing of a mobile device, such as a mobile phone, which transmits EM radiation.

Furthermore, in embodiments of the invention, the under coat obtained in the under coat forming steps is created by spraying or dipping or spinning applications or in-mold transfer printing of the coating composition, and the coating composition is then irradiated with suitable energy for hardening purposes.

Additionally, in embodiments of the invention, the coating composition used in the under coat formation comprises: 45-95 parts by weight of urethane methacrylate obtained in the reaction of polyester diol from polyalkylene glycol and adipic acid, a diisocyanate compound and hydroxyl methacrylate, 1-50 parts by weight of a non-urethane methacrylate compound having at least an intra-molecular radical polymeric double bond, and 0.1-15 parts by weight of a photopolymerization initiator.

As used herein, "polyalkylene glycol" can be used interchangeably with "polyalkylene diol" and "alkylene glycol", examples including: ethylene glycol, polyethylene glycol, propylene glycol, polypropylene glycol, tetramethylene glycol, polytetramethylene glycol, and combination thereof. The preferable alkylene glycol is ethylene glycol, propylene glycol, and tetramethylene glycol, so as to obtain a composition with a low viscosity.

In embodiments of the invention, the polyalkylene glycol as described above is reacted with adipic acid to obtain a polyester diol.

Furthermore, in embodiments of the invention, examples of a diisocyanate compound having at least two isocyanate groups include tolylene diisocyanate, xylylene diisocyanate, isophorone diisocyanate, and tetramethyl xylylene diisocyanate. A preferred diisocyanate compound is tolylene diisocyanate as it is highly reactive, inexpensive, and easy to obtain.

Additionally, in embodiments of the invention, a hydroxyl methacrylate refers to a compound containing at least one methacryloyloxy group and at least one hydroxyl group. Examples of hydroxyl methacrylate include 2-hydroxyethyl methacrylate, 2-hydroxypropylmethacrylate, 3-hydroxypropylmethacrylate, 3-hydroxy propyl methacrylate, 4-hydroxy propyl methacrylate, 5-hydroxy propyl methacrylate, 6-hydroxy propyl methacrylate, cyclohexane dimethanol mono (meth)-acrylate, adduct of 2-hydroxy ethyl methacrylate and caprolactone, adduct of 4-Hydroxyethyl methacrylate and caprolactone, trimethylolpropane diacrylate, pentaerythritol triacrylate, dipentaerythritol pentaacrylate, and combinations thereof.

In embodiments of the invention, a urethane methacrylate is obtained in the reaction of a diisocyanate compound and hydroxyl methacrylate in polyester diol, and comprised in 45-95 parts (by mass).

In embodiments of the invention, a compound having at least one intra-molecular radical polymeric double bond excludes urethane methacrylate as described above, and comprised in 1-50 parts (by mass).

Furthermore, in embodiments of the invention, examples of a compound having at least one intra-molecular radical polymeric double bond include hexa-functional methacrylate, such as poly di-pentaerythritol hexamethylacrylic acid ester, caprolactone modified poly di-pentaerythritol hexamethylacrylic acid ester; penta-functional methacrylate, such as di-pentaerythritol hexamethylacrylic acid ester, caprolactone-modified poly di-pentaerythritol hexamethylacrylic acid ester; tetra-functional methacrylate, such as bis-trihydoxyamethylpropane tetramethylacrylic acid ester, pentaerythritol tetramethylacrylic acid ester, pentaerythritol ethoxy-modified tetramethylacrylic acid ester; tri-functional methacrylate, such as trihydoxyamethylpropane trimethylacrylic acid ester, triethoxy trihydroxyamethylpropane trimethylacrylic acid ester, pentaerythritol trimethylacrylic acid ester, ethoxy pentaerythritol trimethylacrylic acid ester, tri(2-acryloyloxyethyl)isocyanuric acid ester, C2-5 aliphatic hydrocarbon-modified trihydroxyamethylpropane triacrylic acid ester; di(meth)acrylic acid ester, such as such as ethylene glycol di(meth)acrylate, 1,3-butylene glycol di(meth)acrylate, 1,4-butylene glycol di(meth)acrylate, 1,6-dihydroxyhexane di(meth)acrylate, nonanediol di(meth)acrylate, neopentyl glycol di(meth)acrylate, methyl nonanediol di(meth)acrylate, dimethyl nonanediol di(meth)acrylate, hydroxyneopentyl glycol di(meth)acrylate, tetraethylene glycol di(meth)acrylate, triethylene glycol di(meth)acrylate, poly butylene glycol di(meth)acrylate, tricyclodecane dimethanol di(meth)acrylate, bis(2-methacryloyloxyethyl)-2-hydroxyethyl isocyanuric acid ester, cyclohexane dimethanol di(meth)acrylate, poly ethoxycyclohexane dimethanol di(meth)acrylate, poly propoxycyclohexane dimethanol di(meth)acrylate, polyethoxylated bisphenol A di(meth)acrylate, polypropoxylated bisphenol A di(meth)acrylate, hydrogenated bisphenol A di(meth)acrylate, polyethoxyl hydrogenated bisphenol A di(meth)acrylate, polypropoxyl hydrogenated bisphenol A di(meth)acrylate, bisphenoxy fluoren ethanol di(meth)acrylate, neopentyl glycol modified trimethylolpropane di(meth)acrylate, di(meth)acrylate of hydroxy pivalic acid neopentyl glycols-butyrolactone adduct (addition mole number n+m=2-5), di(meth)acrylate of hydroxy pivalic acid neopentyl glycol γ-butyrolactone adduct (n+m=2-5), di(meth)acrylate of neopentyl glycol caprolactone adduct (n+m=2-5), di(meth)acrylate of butylene glycol caprolactone adduct (n+m=2-5), di(meth)acrylate of cyclohexanediol glycol caprolactone adduct (n+m=2-5), di(meth)acrylate of dicyclopentanediol caprolactone adduct (n+m=2-5), di(meth)acrylate of bisphenol A caprolactone adduct (n+m=2-5), di(meth)acrylate of hydrogenated bisphenol A caprolactone adduct (n+m=2-5), di(meth)acrylate of bisphenol F butyrolactone adduct (n+m=2-5), 2-hydroxyethyl (meth)acrylate, 2-hydroxypropyl (meth)acrylate, 4-hydroxybutyl (meth)acrylate, tetrahydrofurfuryl (meth)acrylate, phenoxyethyl (meta)acrylate, cyclohexyl (meta)acrylate, isobornyl (meta)acrylate, 2-(meta)acryloyloxylmethyl-2-methyl biscycloheptane, adamantyl (meth)acrylate, benzyl (meth)acrylate, dicyclopentynyl (meth)acrylate, tetracyclododecanyl (meth)acrylate, cyclohexane dimethanol mono (meth)acrylate, 2-methoxyethyl (meth)acrylate, 3-methoxyethyl (meth)acrylate, methoxy triethylene glycol (meth)acrylate, (meth)acrylate, butoxyethyl (meth)acrylate, methoxy diethylene glycol (meth)acrylate, 4-(meta)acryloyloxylmethyl-2-methyl-2-ethyl-1,3-dioxolane, 4-(meta)acryloyloxylmethyl-2-methyl-2-isobutyl-1,3-dioxolane, trihydroxymethylpropane (meth)acrylate, ethylene oxide-modified phosphate (meth)acrylate, caprolactone-modified phosphate (meth)acrylate; acrylamides, such as acrylic amide, N,N-dimethyl acrylamide, N,N-dimethy methacrylamide, N-hydroxymethyl acrylamide, N-methoxy methacrylamide, N-butoxy methacrylamide, N-tert-butyl acrylamide, acryloylmorpholine, hydroxyethyl acrylamide, and methylene bisacrylamide.

Polyester di(meth)acrylates can be obtained by the reaction of polyols, such as phthalic acid, succinic acid, hexahydrogen phthalic acid, terta hydrogen phthalic acid, terephthalic acid, nonadioic acid, and adipic acid, with (meth)acrylic acid or derivates thereof; ethoxy (meth)acrylates can be obtained by the reaction of (meth)acrylic acid or derivatives thereof on a bisphenolic epoxy resin obtained from the condensation reaction of bisphenol, such as bisphenol A, bisphenol F, bisphenol S, and tetrabromo bisphenol A, with epichlorohydrin; urethane (meth)acrylates can be obtained by the reaction of organic diisocyanate compounds, such as tolylene diisocyanate, isophorone diisocyanate, xylylene diisocyanate, and dicyclohexylmethane diisocyanate, with hydroxyl containing (meth)acrylate, such as 2-hydroxyethyl (meth)acrylate, 2-hydroxypropyl (meth)acrylate, and 4-hydroxybutyl (meth)acrylate; urethane (meth)acrylates excluding urethane (meth)acrylate as described in component (A), can be obtained by the addition of an organic diisocyanate compound to the hydroxyl group of alkanadiol, polyetherdiol, polyesterdiol or spiroglycol, or mixtures thereof, and the reaction of hydroxyl (meth)acrylate containing at least one methacryloyloxy group and at least one hydroxyl group, on the remaining isocyanate groups; vinyl compounds, such as styrene, α-methyl styrene, 2-hydroxy vinyl ether, ethylene glycol divinyl ether, and triethylene glycol divinyl ether; propylene, such as diallyl phthalate, diallyl terephthalate, diallyl isophthalate, and diethylene glycol dialkyl carbonate.

Additionally, in embodiments of the invention, the photopolymerization initiator comprises 0.1-15 parts (by mass). Examples of photopolymerization initiators include carbonyl compounds, such as benzoin, benzoin monomethyl ether, benzoin diisopropyl ether, benzoin isobutyl ether, acetoin, benzyl, benzophenone, p-methoxybenzophenone, Diethoxyacetophenone, benzil methyl ketal, 2,2-diethoxyacetophenone, 1-hydroxycyclo phenyl ketone, methyl benzoyl formate, ethylphenyl glyoxylate, 2-hydroxy-2-methyl-1-diphenylpropane-1-one, and 2-ethylanthraquinone; sulfur compounds, such as tetramethylthiura monosulfide, and tetramethylthiuram disulfide; and acyl phosphine oxides, such as trimethylbenzoyl Diphenyl phosphine oxide.

The compounds described above can be used alone or in combination with two or more compounds.

Thus, in embodiments of the invention, a coating composition comprising 45-95 parts by weight of urethane methacrylate obtained in the reaction of polyester diol from polyalkylene glycol and adipic acid, a diisocyanate compound and a hydroxyl group containing methacrylate, 1-50 parts by weight of a non-urethane methacrylate compound having at least an intra-molecular radical polymeric double bond, and 0.1-15 parts by weight of a photopolymerization initiator (by mass) is obtained.

In embodiments of the invention, the surface of the base material is coated with the coating composition as described above by a way of a spraying or a dipping or a spinning application or in-mold transfer printing.

In embodiments of the invention, the coating composition as described above is hardened by irradiation of a suitable energy source, such as UV light.

In one embodiment of the invention, a non-conductive film is formed by performing vacuum deposition of indium (In) or tin (Sn) in a suitable vacuum deposition chamber, such as an electron beam deposition or vacuum thermal deposition, on an upper surface of the under coat, so as not to connect crystalline structure thereof Furthermore, in one embodiment of the invention, a non-conductive film without a crystalline structure is formed by the vacuum deposition of indium (In) or tin (Sn) at a the depth of 50-100 angstroms)(.ANG.).

In embodiments of the invention, in the step of hard coat layer formation, a UV-hardening resin, or 1 drop of poly acrylic urethane resin, or 2 drops of poly acrylic urethane resin, or 2 drops of acrylic silicon resin is applied onto an upper surface of the non-conductive film by a spraying or a dipping or a spinning application or in-mold transfer printing. The applied layer of UV-hardening resin, or 1 drop of poly acrylic urethane resin, or 2 drops of poly acrylic urethane resin, or 2 drops of acrylic silicon resin is hardened by irradiation of a suitable energy source to form a hard coat layer, thereby carrying out the method of forming an iridescent decoration.

In other embodiments of the invention, the non-conductive film is formed by performing vacuum deposition of indium (In) and tin (Sn) in a suitable vacuum deposition chamber, such as electron beam deposition or vacuum thermal deposition, on an upper surface of the under coat, so as not to connect crystalline structures thereof, respectively. Furthermore, in one embodiment of the invention, a non-conductive film without a crystalline structure is formed by the vacuum deposition of indium (In) or tin (Sn) at a depth of 50-100 angstroms)(.ANG.).

In further embodiments of the invention, the non-conductive film is formed by performing vacuum deposition of at least one non-conductive material selected from silica (SiO), silicon dioxide (SiO2), zirconium dioxide (ZrO2), cerium oxide (CeO2), alumina (Al2O3), titanium oxide (Ti3O5), magnesium oxide (MgO), and chromium (Cr) by vacuum deposition, such as electron beam deposition or vacuum thermal deposition, on an upper surface of the under coat.

In summary, the present invention is characterized by proving a decorating method involving the vacuum deposition on an upper surface of the under coat to form a non-conductive film, which thus can provide good EM transmission for communications devices, such as mobile phones and other portable devices, and which may decorate the surface of EM transmitting parts to form an under coat, conductive film layer, and hard coat in a simple process. The decoration can display a rainbow colors, and is suitable as a high quality metal gloss.

Other Embodiments

All of the features disclosed in this specification may be combined in any combination. Each feature disclosed in this specification may be replaced by an alternative feature serving the same, equivalent, or similar purpose. Thus, unless expressly stated otherwise, each feature disclosed is only an example of a generic series of equivalent or similar features.

From the above description, one skilled in the art can easily ascertain the essential characteristics of the present invention, and without departing from the spirit and scope thereof, can make various changes and modifications of the invention to adapt it to various usages and conditions. Thus, other embodiments are also within the claims.

What is claimed is:

1. An iridescent color decorating method comprising:
    coating a base material surface with a coating composition by spraying, dipping, spinning, or in-mold transfer printing, the coating composition comprising:
        45-95 parts by weight of urethane methacrylate obtained by reacting a polyester diol with a diisocyanate compound and hydroxyl methacrylate, wherein the polyester diol is a reaction product of a polyalkylene glycol and adipic acid,
        1-50 parts by weight of a compound that is not urethane methacrylate and having at least an intra-molecular radical polymeric double bond, and
        0.1-15 parts by weight of a photopolymerization intitiator;
    hardening the coating composition by active energy irradiation to form an under coat;
    performing vacuum deposition, by electron beam heating or vacuum thermal deposition, of at least zirconium dioxide ($ZrO_2$) onto an upper surface of the under coat to form a non-conductive film layer;
    applying a UV-hardening resin, or 1 drop of poly acrylic urethane resin, or 2 drops of poly acrylic urethane resin, or 2 drops of acrylic silicon resin onto an upper surface of the non-conductive film by a spraying, dipping or spinning application or by in-mold transfer printing to form a coated layer; and
    hardening the coated layer by active energy irradiation to form a hard coat layer,
        wherein the base material surface is decorated in iridescent color thereby.

* * * * *